United States Patent
Gaalaas (10) Patent No.: US 7,053,807 B1
(45) Date of Patent: May 30, 2006

(54) APPARATUS AND METHOD FOR CONTROLLING THE STATE VARIABLE OF AN INTEGRATOR STAGE IN A MODULATOR

(75) Inventor: Eric Gaalaas, Bedford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/070,990

(22) Filed: Mar. 3, 2005

(51) Int. Cl.
*H03M 3/00* (2006.01)

(52) U.S. Cl. .................... 341/143; 341/172

(58) Field of Classification Search ......... 341/110–172
See application file for complete search history.

(56) References Cited

U.S. PATENT DOCUMENTS

| | | | |
|---|---|---|---|
| 3,891,933 A | | 6/1975 | Suzuki et al. |
| 5,012,244 A | | 4/1991 | Wellard et al. |
| 5,453,716 A | | 9/1995 | Person et al. |
| 5,841,310 A | * | 11/1998 | Kalthoff et al. ............ 327/337 |
| 6,040,793 A | * | 3/2000 | Ferguson et al. .......... 341/143 |
| 6,061,009 A | | 5/2000 | Krone et al. |
| 6,084,467 A | | 7/2000 | Muza |
| 6,175,270 B1 | | 1/2001 | Vannucci |
| 6,362,763 B1 | * | 3/2002 | Wang ......................... 341/143 |
| 6,724,332 B1 | * | 4/2004 | Melanson .................. 341/143 |
| 6,822,594 B1 | * | 11/2004 | Melanson et al. .......... 341/143 |

OTHER PUBLICATIONS

Seppanen et al., "Maximization of the Subjective Loudness of Speech with Constrained Amplitude", Proc. 1999 IEEE Workshop on Apps. of Signal Processing to Audio & Acoustics, New Paltz, New York pp. 139-142 (Oct. 1999).
Candy, James C., A "Use of Double Integration in Sigma Delta Modulation", IEEE Transactions on Communications, Vol. Com-33, No. 3, pp. 249-258 (Mar. 1985).
Nielsen, K., "A Review and Comparison of Pulse Width Modulation (PWM) Methods for Analog and Digital Input Switching Power Amplifiers," 102nd AES Convention, Munich, Germany, preprint 4446 (G4), pp. 1-57 (1997).

* cited by examiner

*Primary Examiner*—Linh V. Nguyen
(74) *Attorney, Agent, or Firm*—Iandiorio & Teska (57) ABSTRACT

An apparatus for controlling the state variable of an integrator stage in a modulator including a detector circuit for generating an overload signal when the modulator is overdriven, a control circuit responsive to the overload signal for generating switching control signals during the overdriven condition, and an integrating capacitance circuit having an unswitched portion and a switched portion and responsive to the switching signals for repeatedly connecting the switched portion between the unswitched portion and a discharge path to receive and drain charge when the modulator is overdriven to increase the lossiness of the integrator stage and control a state variable of the modulator.

15 Claims, 6 Drawing Sheets

APPARATUS AND METHOD FOR CONTROLLING THE STATE VARIABLE OF AN INTEGRATOR STAGE IN A MODULATOR

FIELD OF THE INVENTION

This invention relates to an apparatus and method for dynamically increasing the lossiness of an integrating capacitance of an integrator stage in a modulator during an overdrive condition to effectively control the state variable(s) of the integrator stage.

BACKGROUND OF THE INVENTION

Higher-order modulators, e.g., third-order or higher modulators, such as sigma-delta modulators, pulse-width modulators, and the like require some mechanism to reset or control the modulator when the modulator is overdriven to prevent unstable conditions that can produce undesirable transients in the output signal.

One conventional device to control a higher-order modulator from being overdriven relies on resetting the state variable(s) (e.g., any quantity that indicates the current state of the modulator, such as the output voltage at each integrator stage, or the charge on the integrating or switched capacitor) to zero, or a stable point, when the modulator enters an unstable condition (e.g., overdriven or overloaded). The device typically employs a switched capacitor network at the input to the integrator stage which includes an operational amplifier (op amp). An integrating capacitor is typically coupled in the feedback loop between the output and input of the op amp. The feedback path of the integrating capacitor also typically includes a reset switch. The reset switch is usually coupled to a detection device that monitors the occurrence of an unstable condition. When the unstable condition is detected, the reset switch is closed which resets to zero the integrating capacitor of the integrator stage. This resets the state variable(s) to a zero state, e.g., a stable state or condition. See, for example U.S. Pat. No. 5,021,244, incorporated herein by reference. However, resetting the state variable(s) of the integrator stage to zero results in large transients in the output signal.

Another conventional device and method for resetting the state variable(s) of a higher-order modulator, such as a delta-sigma modulator, is disclosed in U.S. Pat. No. 6,061,009 (the '009 patent), incorporated by reference herein. The '009 patent overcomes the problems associated with resetting the integrating capacitor of integrating stage to zero by utilizing reset circuitry connected in series with the reset switch in the feedback loop of the integrating capacitor. The reset circuitry introduces a "lossy" circuit (impedance), e.g., a second capacitor, in the reset/feedback loop of the integrator. Instead of instantaneously short circuiting the connection across the integrating capacitor with the closure of the reset switch, the device as disclosed in the '009 patent "adds" an impedance in parallel with the integrating capacitance in the reset feedback loop when an overdriven condition is detected. The added impedance, e.g., capacitor, receives leakage from the integrating capacitance to adjust the state variable(s) of the integrator stage to allow the integrator stage to operate as a "lossy integrator" when the modulator is overdriven. When the overdriven condition is no longer present, the reset switch is opened and the lossy circuit is taken out of the feedback loop. However, the apparatus as disclosed in the '009 patent utilizes significant chip space because two separate capacitors must be utilized: one for the integrating capacitor and another for the "lossy circuit". When the modulator is not overdriven, the capacity of and the area utilized by the lossy circuit is wasted.

SUMMARY OF THE INVENTION

It is therefore an object of this invention to provide an improved apparatus and method for controlling the state variable of an integrator stage in a modulator.

It is a further object of this invention to provide such an apparatus and method which utilizes less space.

It is a further object of this invention to provide such an apparatus and method which dynamically increases the lossiness of an integrator stage in a modulator during an overdrive condition without the need to add additional capacitance.

It is a further object of this invention to provide such an apparatus which eliminates the need for a reset switch between the added capacitance and the integrating capacitor of the integrator stage.

This invention results from the realization that an improved apparatus and method for controlling the state variables(s) of an integrator stage in a modulator can be achieved, not by adding capacitance to an integrator stage in a modulator with a reset switch to increase the lossiness of the integrator stage when the modulator is overdriven, but instead by enabling, during an overdriven condition, one portion of the integrating capacitance itself to repeatedly receive charge from another portion of the integrating capacitance and then repeatedly drain that charge to a discharge path to dynamically increase the lossiness of the integrator stage and control the state variable(s) in the modulator.

The subject invention, however, in other embodiments, need not achieve all these objectives and the claims hereof should not be limited to structures or methods capable of achieving these objectives.

This invention features an apparatus for controlling the state variable of an integrator stage in a modulator including a detector circuit for generating an overload signal when the modulator is overdriven, a control circuit responsive to the overload signal for generating switching control signals during the overdriven condition, and an integrating capacitance circuit having an unswitched portion and a switched portion and responsive to the switching control signals for repeatedly connecting the switched portion between the unswitched portion and a discharge path to receive and drain charge when the modulator is overdriven to increase the lossiness of the integrator and control a state variable of the integrator stage in the modulator.

In one embodiment, the integrating capacitance circuit may include a switching circuit for selectively connecting the switched portion with the unswitched portion and with a discharge path. The switching circuit may include a plurality of switching devices for connecting the switched portion with the unswitched portion and the switched portion with the discharge path. The detector circuit may include a comparator circuit for comparing a predetermined threshold voltage level with a composite voltage signal for generating an overload signal. The apparatus may include a clock circuit for providing first and second phase signals. The control circuit may include gating logic for generating switching control signals in response to the overload signal and the first and second phase signals. The switching control signals may correspond to the first and second phase signals when the modulator is overdriven to repeatedly connect the switched portion with the unswitched portion and the discharge path. The switching control signals may continuously connect the switched portion to the unswitched portion when the modulator is not overdriven. The unswitched portion of the integrating capacitance may include a capacitor. The switched portion of the integrating capacitance circuit may include a capacitor. The integrating capacitance may include a plurality of switched portions and associated switches connected with the unswitched portion for further increasing the lossiness of the integrator stage when the modulator is overdriven. The integrator stage may include an operational amplifier circuit for transferring charge from a sampling capacitor to the integrating capacitance. The integrator stage may include a switched capacitor circuit responsive to an input voltage signal and clock signals for sampling the input voltage with the sampling capacitor in one phase and transferring charge from sampling capacitor to the integrating capacitance in another phase.

This invention features an apparatus for controlling state variables of an integrator stage in a modulator including a detector circuit for generating an overload signal when the modulator is overdriven, an integrating capacitance associated with an integrator stage in the modulator and having an unswitched portion and a switched portion, a switching circuit for selectively connecting the switched portion with the unswitched portion and with a discharge path, and a control circuit responsive to the overload signal and first and second phase signals for connecting the switched portion to the unswitched portion when no overload is detected, and, when an overload is detected, for dedicating the switched portion to be repeatedly connected to the unswitched portion in one phase such that charge from the unswitched portion is drained to the switched portion and in another phase repeatedly connecting the switched portion to the discharge path such that charge from the switched portion is drained to the discharge path to enable the integrator stage to operate as a lossy integrator and control the state variable of the integrator stage in the modulator.

This invention also features a method for controlling the state variable of an integrator stage in a modulator including the steps of detecting when the modulator is overdriven, generating switching control signals during the overdriven condition, and actuating an integrating capacitance circuit with the switching control signals during the overdriven condition to repeatedly disconnect a switched portion from an unswitched portion of the integrating capacitance circuit during one phase to dump charge and connect the switched portion to an unswitched portion during an alternate phase to drain charge from the unswitched portion to increase the lossiness of the integrator stage and control a state variable of the integrator stage in the modulator.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
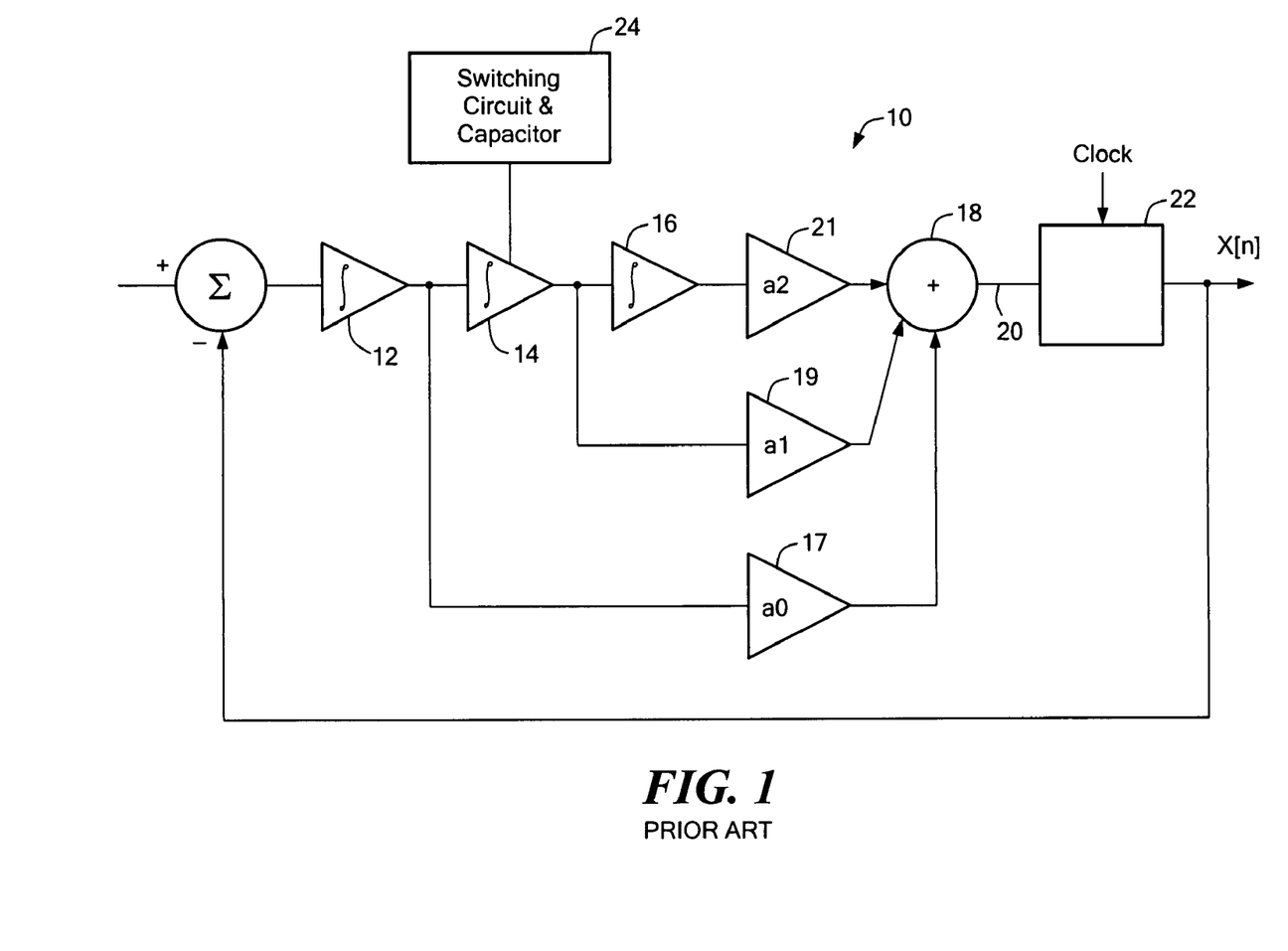
FIG. 1 is a schematic block diagram of a typical prior art higher-order modulator employing a typical prior art apparatus for controlling the state variable of an integrator stage in a modulator.

Conventional modulator 10, FIG. 1, is a typical higher-order modulator. In this example, modulator 10 is a third order delta-sigma modulator and includes three integrator stages 12, 14, and 16. The output of integrator stage 12 is the input to integrator stage 14 and the output of integrator stage 14 is the input to integrator stage 16. The output voltage at each of integrator stages 12–16 is a state variable. The output of each of integrator stages 12–16 is coupled to summing node 18 through amplifiers 17, ($a_0$), 19 ($a_1$) and 21 ($a_2$), respectively. Summing node 18 sums the output of each integrator stage and generates a composite voltage signal ($V_x$) on line 20. The composite voltage signal ($V_x$) on line 20 is input to comparator 22 which is typically clocked at the oversampling rate to quantize the signal. The operation of higher-order modulators, such as modulator 10, e.g., a delta-sigma modulator, or a pulse-width modulator, is known in the art. See for example, "A Use of Double Integration in Sigma-Delta Modulation," by James C. Candy, IEEE Trans. Commun. Vol. COM-33, pp. 249–258, March 1985, U.S. Pat. No. 5,012,244, the '009 patent cited supra, and "A Review and Comparison of Pulse-Width Modulation (PWM) Methods for Analog and Digital Input Switching Power Amplifiers," $102^{nd}$ AES Convention, Munich, Germany, 1997, preprint 4446, all incorporated by reference herein.

Switching circuit and supplemental capacitor circuit 24 for increasing the lossiness of integrator stage 14 of modulator 10 relies on adding an additional capacitance to integrator stage 14 when an overdriven condition is detected and then draining the charge from the added capacitance to increase the lossiness of integrator stage 12 and control the state variable(s) in modulator 10.

Figure 2:
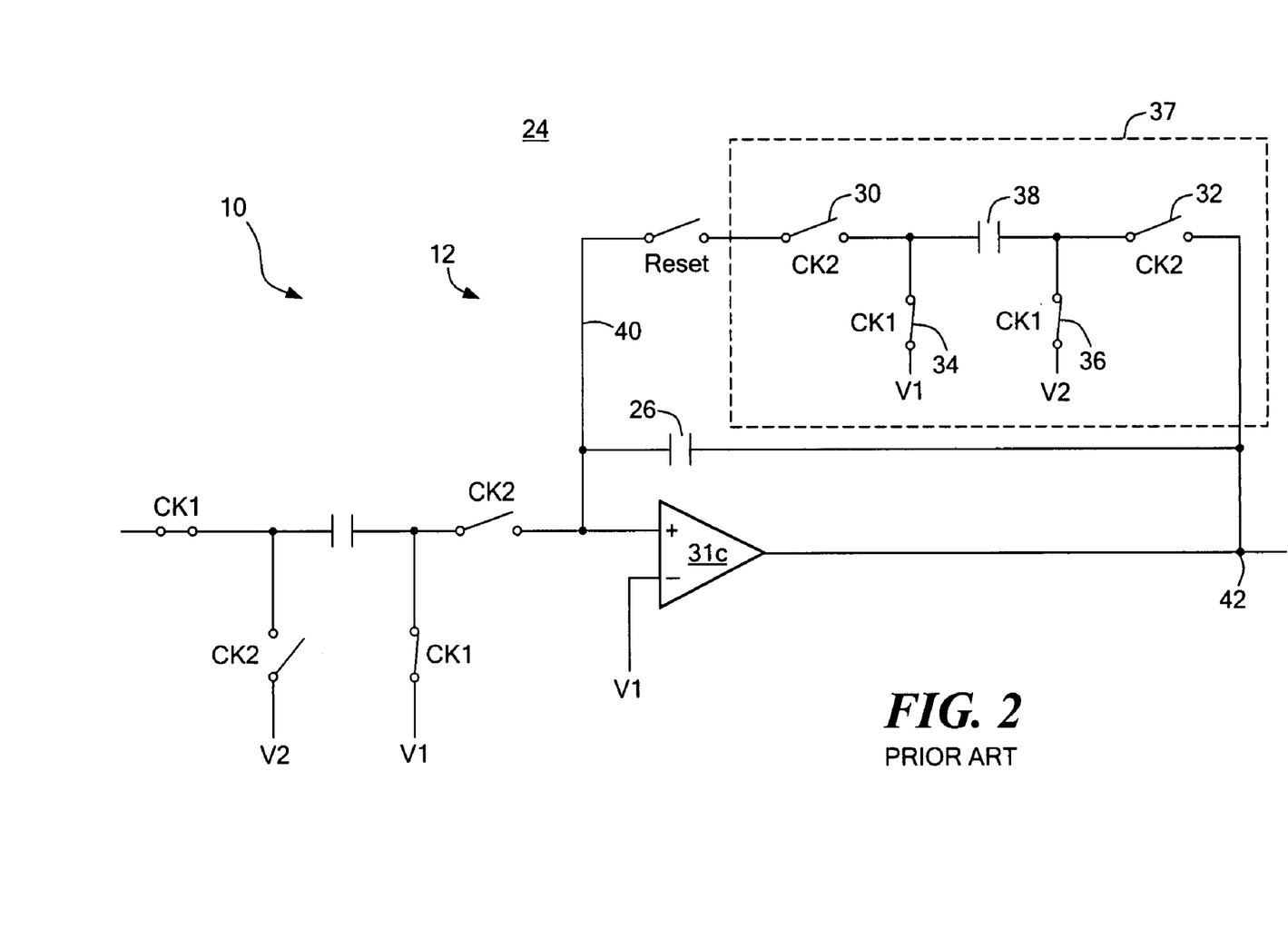
FIG. 2 is a schematic block diagram showing in further detail the prior art apparatus for controlling the state variable of an integrator stage in the modulator shown in FIG. 1.

Switching circuit and supplemental capacitor circuit 24, FIG. 2, where like parts have been given like numbers, includes integrating capacitor 26 that is utilized when integrator stage 12 is operating normally and provides no "lossiness". When modulator 10 is overdriven, switching circuit and supplemental capacitor circuit 24 add additional circuitry 37 with capacitor 38 and switching devices 30, 32, 34 and 36 in feedback loop 40 by closing reset switch 28. This allows integrator stage 12 to operate as a lossy integrator. See the '009 patent cited supra. However, adding circuitry 37 with capacitor 38 uses valuable chip space to accommodate additional capacitor 38. When the overdrive condition no longer exists, reset switch 28 is open and integrator stage 12 operates with only integrating capacitor 26. In this condition, capacitor 38 is unnecessary and the area utilized by capacitor 38 is wasted.

Figure 3:
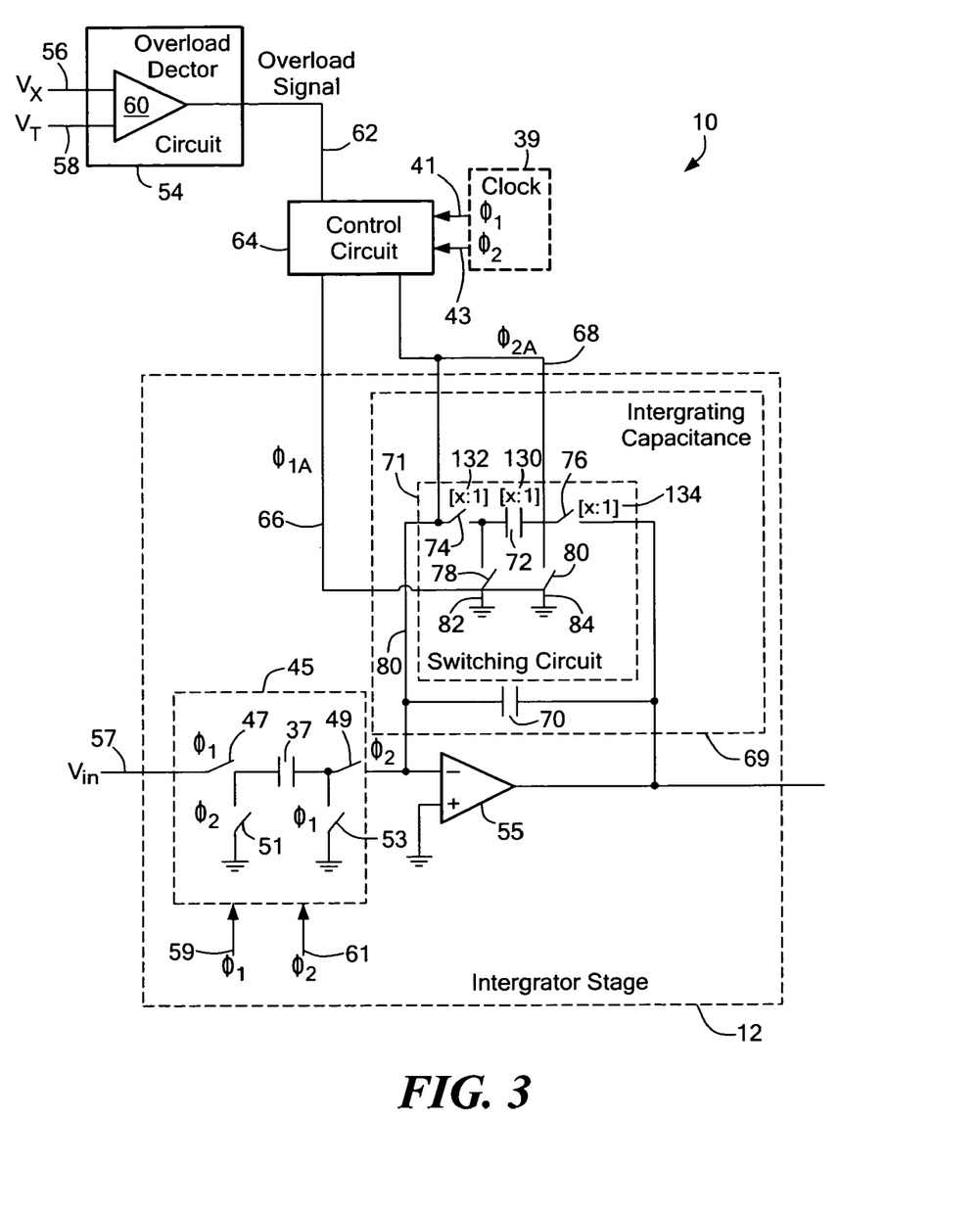
FIG. 3 is a schematic block diagram of one embodiment of the apparatus for controlling the state variable of an integrator stage in a modulator of this invention.

In contrast, apparatus 50, FIG. 3, where like parts have been given like numbers, for controlling the state variable of integrator stage 12 of modulator 10 of this invention includes overload detector circuit 54 responsive to a composite voltage signal, $V_X$, on line 56 and a predetermined threshold voltage level, $V_T$, on line 58. Overload detector circuit 54 includes comparator 60 that compares the composite voltage signal, $V_X$, on line 56 to the predetermined threshold voltage level, $V_T$, on line 58 and asserts an overload signal on line 62 when the composite voltage signal, $V_X$, on line 56 exceeds the predetermined threshold voltage level, $V_T$, on line 58 (i.e., when modulator 10 is overdriven).

Control circuit 64 is responsive to the overload signal on line 62 and first and second phase signals $\phi_1$ and $\phi_2$, on lines 41 and 43, respectively, provided by clock circuit 39 (also shown in detail in FIG. 5) and generates switching control signals $\phi_{1A}$ and $\phi_{2A}$ on lines 66 and 68, respectively. Integrating capacitance circuit 69 is responsive to control signals $\phi_{1A}$ and $\phi_{2A}$ on lines 66 and 68 and includes unswitched portion 70, and switched portion 72. Switching circuit 71 includes switching devices 74, 76, 78, and 80 that alternately and repeatedly connect switched portion 72 to unswitched portion 70 in one mode, and to discharge paths 82 and 84 in the other to allow integrator stage 12 to operate as a lossy integrator (discussed below).

During normal operation, the control signals $\phi_{1A}$ and $\phi_{2A}$ on lines 66 and 68 enable switching devices 74 and 76 to close and switching devices 78 and 80 to open to connect unswitched portion 70 with switched portion 72 and operate as the defined integrating capacitance. Integrator stage 12 operates normally without "lossiness".

When modulator 10 is overdriven, the control signals $\phi_{1A}$ and $\phi_{2A}$ on lines 66 and 68 enable switching circuit 71 to temporarily borrow switched portion 72 of integrating capacitance circuit 69 to repeatedly receive and drain charge from unswitched portion 70 by opening and closing switching devices 74, 76, 78, and 80. The charge received by switched portion 72 is repeatedly drained to discharge path 82 and 84 by opening and closing switching devices 78 and 80 (discussed in further detail below). The result is that the lossiness of integrator stage 12 is dynamically increased when modulator 10 is overdriven and the state variable(s) of integrator stage 12 are controlled. And yet no capacitance is required other than that required as the original defined integrating capacitance.

Hence, apparatus 50 of this invention relies on dedicating a portion of single integrating capacitance circuit 69 (e.g., switched portion 72) to repeatedly receive and drain charge from another portion (e.g., unswitched portion 70) of single integrating capacitance circuit 69 to dynamically increase the lossiness of integrator stage 12 during an overdriven condition. Because there is no need to add an additional separate capacitance as found in the prior art, apparatus 50 of this invention utilizes less chip space and eliminates the need for a reset switch between an added capacitor and the integrating capacitor.

Although as shown in FIG. 3, apparatus 50 is used to increase the lossiness of integrator stage 12 of modulator 10, this is not a necessary limitation of this invention, as apparatus 50 may be utilized in any integrator stage of any type of higher order modulator, such as a pulse-width modulator for a power amplifier, a sigma-delta modulator for a power amplifier or any higher-order modulator known to those skilled in the art.

In operation, the control signals $\phi_{1A}$ and $\phi_{2A}$ on line 66 and 68 enable switching devices 78–80 and 74–76, respectively, such that in one phase the control signal $\phi_{1A}$ on line 66 closes switching devices 78 and 80 and the control signal $\phi_{2A}$ on line 68 opens switching devices 74 and 76. In this state, charge from switched portion 72 will drain via discharge paths 82 and 84. In the next phase, the control signal $\phi_{1A}$ on line 66 will open switching devices 78 and 80 while control signal $\phi_{2A}$ on line 68 will close switching devices 74 and 76. This allows charge from unswitched portion 70 to drain via line 80 and be absorbed or stored in unswitched portion 70. The process is repeated over a number of phases (discussed below) until the overdrive condition no longer exists, as detected by overload detector circuit 54.

Integrator stage 12 of apparatus 50 of this invention typically includes switch capacitor network 45 responsive to an input signal ($V_{in}$) on line 57 and first and second phase signals $\phi_1$ and $\phi_2$ on lines 59 and 61 generated by clock circuit 39. Capacitor network 45 includes switched capacitor 37 and a plurality of switching devices 47, 49, 51, and 53. Generally, switching devices 47 and 53 are closed during one clock phase (e.g., phase $\phi_1$) to sample the input signal voltage ($V_{in}$) with sampling capacitor 37. During a different clock phase, e.g., phase $\phi_2$, switching devices 49 and 51 are closed to transfer the stored charge in sampling capacitor 37 to the integrating capacitance circuit 69. The operation of switched capacitor networks is known in the art. See for example, the '009 patent cited supra.

Figure 4:
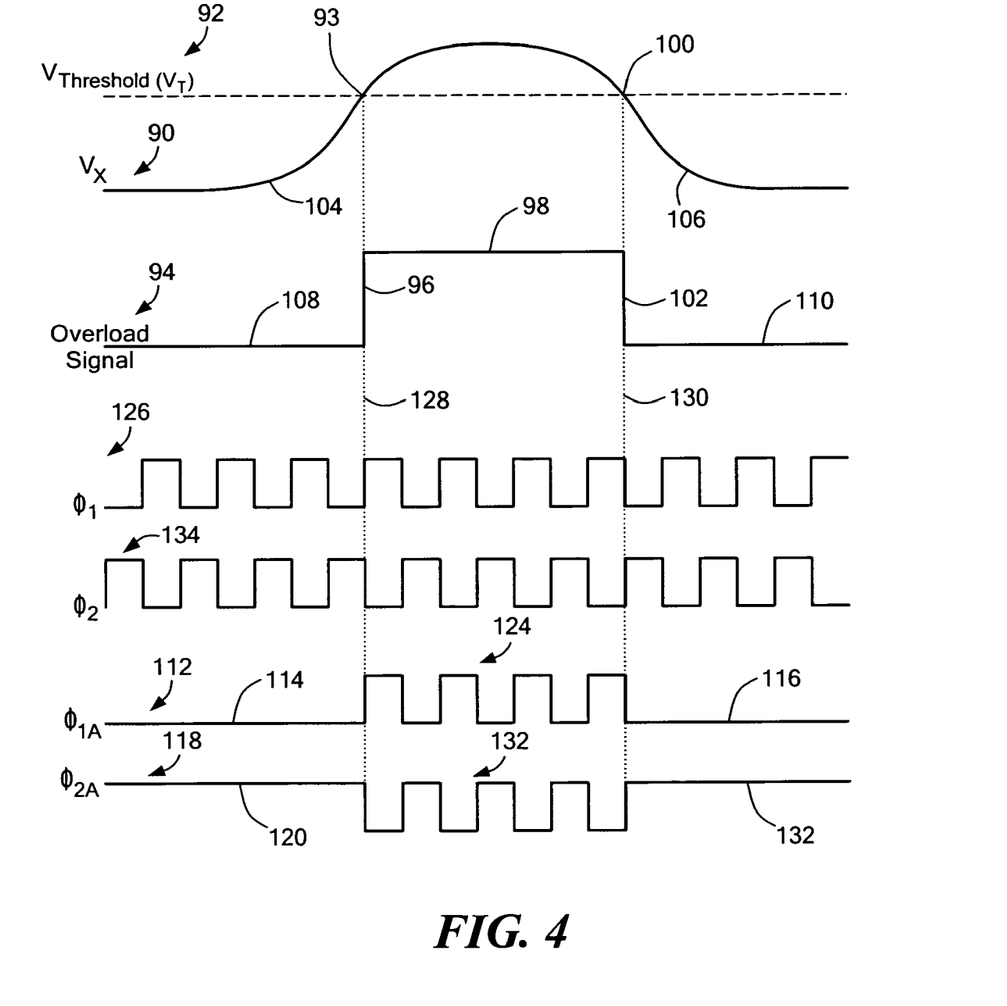
FIG. 4 is a timing diagram for the apparatus for controlling the state variable of an integrator stage in a modulator shown in FIG. 3.

Further details of an example of the operation of apparatus 50 of this invention are described below in reference to the timing diagram shown in FIG. 4. When composite voltage ($V_X$) signal 90 exceeds at 93 predetermined threshold voltage ($V_T$) level 92, overload signal 94 is asserted to a logical high, as shown by transition 96. Overload signal 94 rises to logical high 98 until modulator 10 is no longer overdriven, e.g., when composite voltage ($V_X$) signal 90 drops at 100 below predetermined threshold voltage ($V_T$) level 92. At this point, overload signal 94 transitions 102 from a logical high to a logical low. When modulator 10 is not overdriven, e.g., when composite voltage ($V_X$) signal 90 is less than predetermined threshold voltage ($V_T$) level 92, e.g., at points 104 and 106, overload signal 94 is at a constant value 108 and 110 (e.g., a logical low). In this state, control circuit 64 generates control signal $\phi_{1A}$ 112 at a constant logical low, indicated at 114 and 116, and control signal $\phi_{2A}$ 118 at a constant logical high, indicated at 120 and 122. This enables switching devices 78 and 80 to remain open and switching devices 74 and 76 to remain closed. This connects unswitched portion 70 to switched portion 72 and integrator stage 12 operates normally and provides no "lossiness".

Overload signal 94 generates from (or passes) phase signal $\phi_1$ 126 to form pulse train 124 of control signal $\phi_{1A}$ 112. Overload signal 94 generates from (or passes) phase signal $\phi_2$ 134 to form pulse train 132 of control signal $\phi_{2A}$ 118. Typically, phase signal $\phi_1$ 126 and phase signal $\phi_2$ 134, and thus control signal $\phi_{1A}$ 112 and control signal $\phi_{2A}$ 118, are 180° out of phase. Pulse train 124 of control signal $\phi_{1A}$ 112 enables switching circuit 71 to alternately and repeatedly open and close switching devices 78 and 80 and pulse train 132 of control signal $\phi_{2A}$ 118 enables switching circuit 71 to alternately and repeatedly open and close switching devices 74 and 76. Thus, when modulator 10, FIG. 3, is overdriven, switched portion 72 will repeatedly discharge through discharge paths 82 and 84 in one phase and in the other phase, will charge from unswitched portion 70. The result, as discussed above, is that integrating capacitance circuit 69 effectively increases the lossiness and controls the state variable, e.g., the composite voltage, $V_X$, on line 56 of integrator stage 12 in modulator 10 without the need to for any additional capacitance that would be idle during normal operating conditions. Only the single defined integrating capacitance 69 is required, although the switched portion of it is sacrificed to alternately scoop and drain charge from the unswitched portion.

Although as discussed above, integrator capacitance circuit 69 includes only one switched portion 72 connected with unswitched portion 70, this is not a necessary limitation of this invention, as integrating capacitance circuit 69 may include a plurality of switched portions 130 and a plurality of associated switching devices 132 and 134 connected with switched portion 72 to provide for increased lossiness to integrator stage 12. But the notion is that all that is required is only as much capacitance as required for the integrating capacitance itself. No extra capacitance is needed to introduce the lossiness. That is accomplished by using the switched portion to drain charge only during overdriven conditions and during normal conditions to operate as one part of the necessary integrating capacitance.

Figure 5:
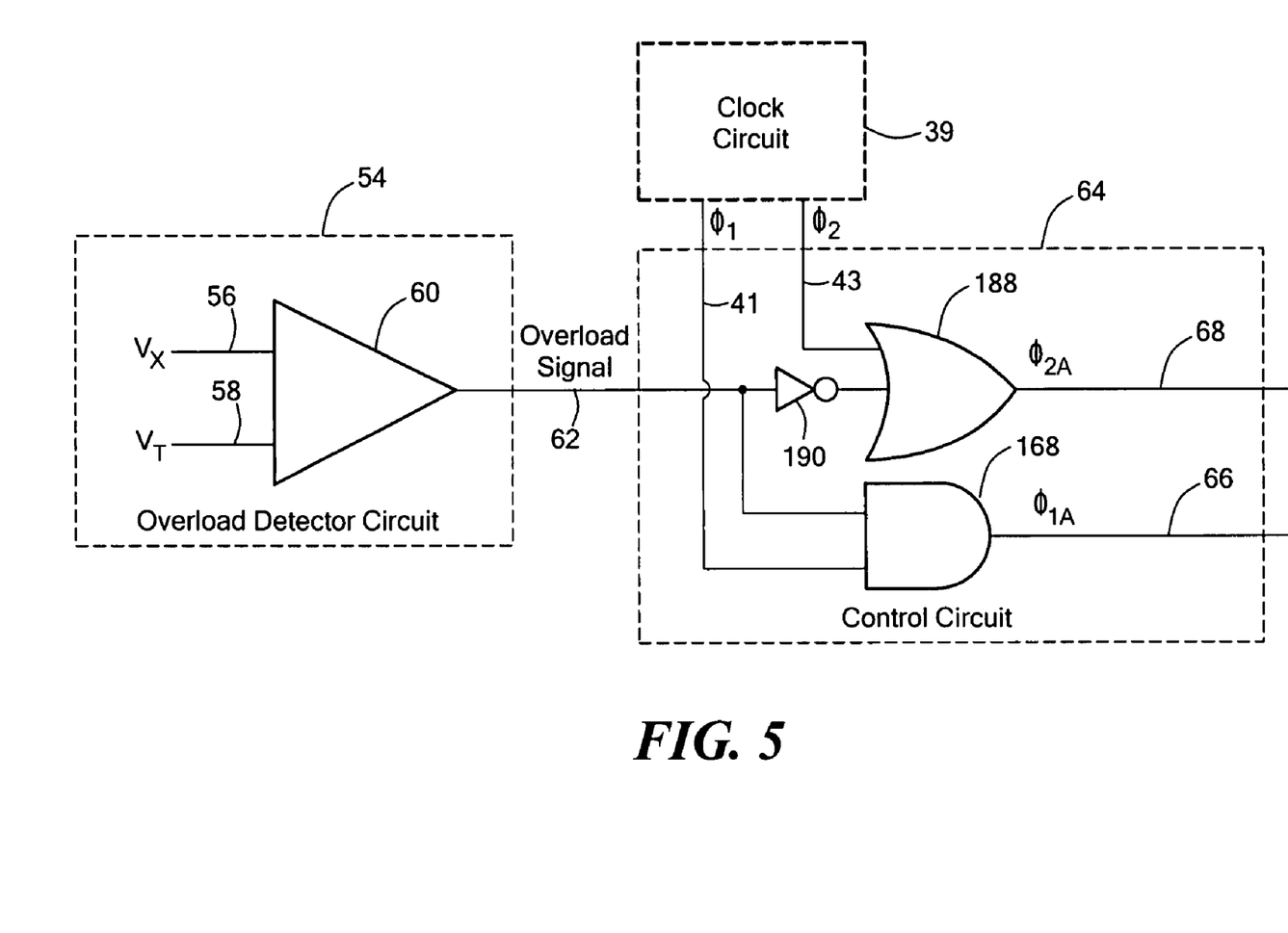
FIG. 5 is a schematic block diagram showing in further detail the structure of the control circuit shown in FIG. 2.

Control circuit 36, FIG. 5, where like parts have been given like numbers, typically includes logic gates, such as AND gate 168 and OR gate 188 that generate the control signals $\phi_{1A}$ and $\phi_{2A}$ on lines 66 and 68, respectively, in response to the overload signal on line 62 and the first and second phase signals $\phi_1$ and $\phi_2$ on lines 41 and 43. AND gate 168 is responsive to the phase signal $\phi_1$ on line 41 and the overload signal on line 62 and generates the control signal $\phi_{1A}$ on line 66. OR gate 188 is responsive to phase signal $\phi_2$ on line 43 and the overload signal on line 62, which is inverted by inverter 190, and generates control signal $\phi_{2A}$ on line 68. The operation of AND gate 168 and OR gate 188 of control circuit 64 in response to the overload signal on line 62 and the first and second phase signals $\phi_1$ and $\phi_2$ is described by the logic tables below:

| (AND) Logic Table 1 | | |
|---|---|---|
| Overload Signal | $\phi_1$ | $\phi_{1A}$ |
| 0 | 0 | 0 |
| 0 | 1 | 0 |
| 1 | 0 | 0 |
| 1 | 1 | 1 |

| (OR) Logic Table 2 | | |
|---|---|---|
| Overload Signal | $\phi_2$ | $\phi_{2A}$ |
| 0 | 0 | 1 |
| 0 | 1 | 1 |
| 1 | 0 | 0 |
| 1 | 1 | 1 |

Figure 6:
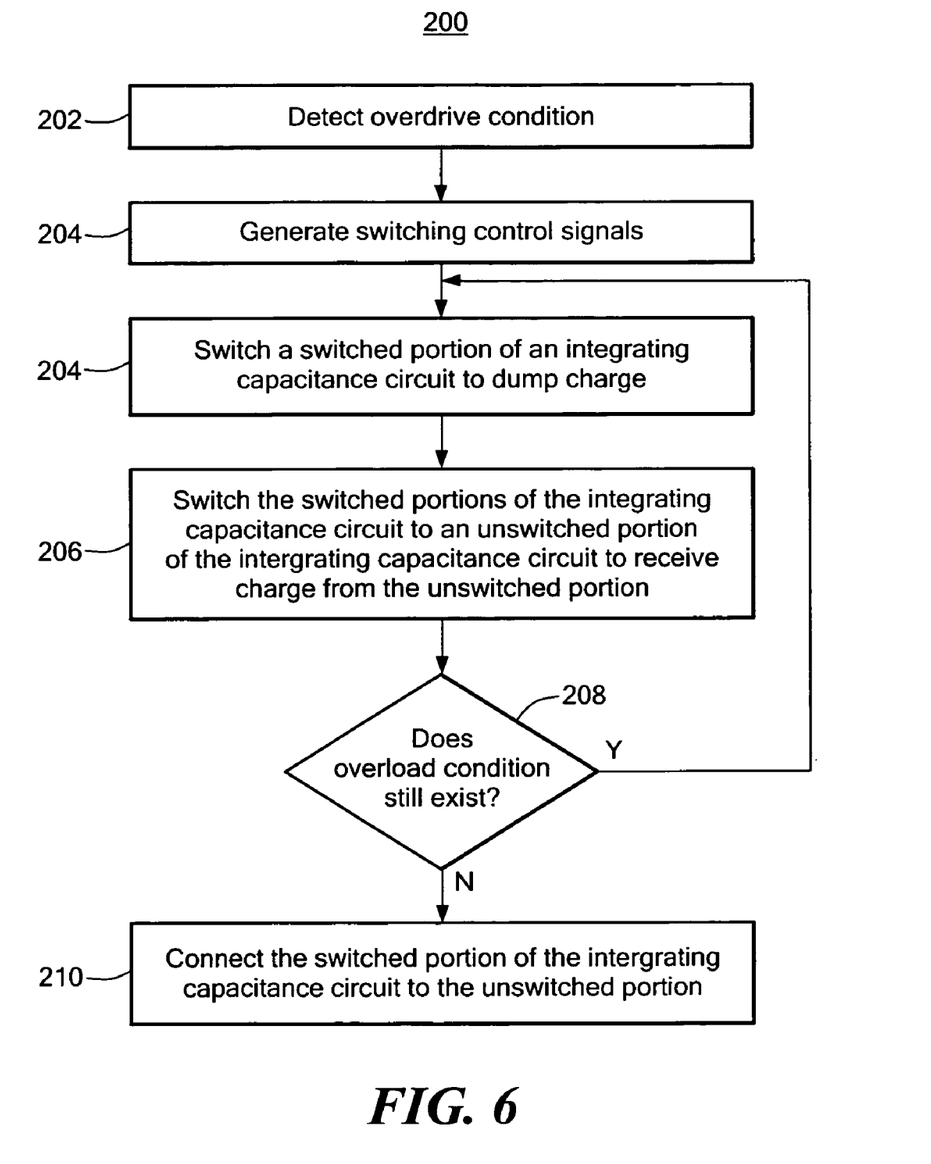
FIG. 6 is a schematic block diagram showing an example of the method for controlling the state variable of an integrator stage in a modulator of this invention.

Method 200, FIG. 6, for controlling the state variable of an integrator stage in a modulator of this invention includes detecting an overdriven condition in a modulator, step 202. In response to the overdriven condition switching control signals are generated, step 204. The switching control signals enable a switched portion of an integrating capacitance circuit to dump charge, step 204. The switched portion of the integrating capacitance circuit is then switched to an unswitched portion of the integrating capacitance circuit to receive charge from the unswitched portion, step 206. A determination is made whether an overdriven condition still exists, step 208. If an overdriven condition still exists, steps 204 and 206 are repeated to continue the lossiness of integrator stage 12 and control a state variable of the modulator, otherwise the switched portion of the integrating capacitance is connected to the unswitched portion of the integrating capacitance, step 210, to allow the integrator to operate normally without any "lossiness".

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An apparatus for controlling the state variable of an integrator stage in a modulator comprising:
   a detector circuit for generating an overload signal when the modulator is overdriven;
   a control circuit responsive to said overload signal for generating switching control signals during the overdriven condition; and
   an integrating capacitance circuit having an unswitched portion and a switched portion and responsive to said switching control signals for repeatedly connecting said switched portion between said unswitched portion and a discharge path to receive and drain charge when said modulator is overdriven to increase the lossiness of the integrator and control a state variable of said integrator stage in the modulator.

2. The apparatus of claim 1 in which said integrating capacitance circuit includes a switching circuit for repeatedly connecting said switched portion with said unswitched portion and said discharge path.

3. The apparatus of claim 2 in which said switching circuit includes a plurality of switching devices for connecting said switched portion with said unswitched portion and said switched portion with said discharge path.

4. The apparatus of claim 1 in which said detector circuit includes a comparator circuit for comparing a predetermined threshold voltage level with a composite voltage signal for generating said overload signal.

5. The apparatus of claim 1 further including a clock circuit for providing first and second phase signals.

6. The apparatus of claim 5 in which said control circuit includes gating logic for generating said switching control signals in response to said overload signal and said first and second phase signals.

7. The apparatus of claim 5 in which said switching control signals correspond to said first and second phase signals when said modulator is overdriven to repeatedly connect said switched portion with said unswitched portion and said discharge path.

8. The apparatus of claim 1 in which said switching control signals continuously connect said switched portion to said unswitched portion when said modulator is not overdriven.

9. The apparatus of claim 1 in which said unswitched portion of said integrating capacitance circuit includes a capacitor.

10. The apparatus of claim 1 in which said switched portion of said integrating capacitance includes a capacitor.

11. The apparatus of claim 1 in which said integrating capacitance includes a plurality of switched portions and associated switching devices connected with said unswitched portion for further increasing the lossiness of said integrator stage when said modulator is overdriven.

12. The apparatus of claim 1 in which said integrator stage includes an operational amplifier circuit for transferring charge from a sampling capacitor to said integrating capacitance.

13. The apparatus of claim 12 in which said integrator stage includes a switched capacitor circuit responsive to an input voltage signal and clock signals for sampling said input voltage with said sampling capacitor in one phase and transferring charge from sampling capacitor to said integrating capacitance in another phase.

14. An apparatus for controlling state variables of an integrator stage in a modulator comprising:
    a detector circuit for generating an overload signal when the modulator is overdriven;
    an integrating capacitance associated with an integrator stage in the modulator and having an unswitched portion and a switched portion;
    a switching circuit for selectively connecting said switched portion with said unswitched portion and with a discharge path; and
    a control circuit responsive to said overload signal and first and second phase signals for connecting said switched portion to said unswitched portion when no overload is detected, and, when an overload is detected, for dedicating said switched portion to be repeatedly connected to said unswitched portion in one phase such that charge from said unswitched portion is drained to said switched portion, and in another phase, repeatedly connecting said switched portion to said discharge path such that charge from said switched portion is drained to said discharge path to enable said integrator stage to operate as a lossy integrator and control the state variable of the integrator stage in the modulator.

15. A method for controlling the state variable of an integrator stage in a modulator comprising the steps of:
    detecting when the modulator is overdriven;
    generating switching control signals during the overdriven condition; and
    actuating an integrating capacitance circuit with said switching control signals during the overdriven condition to repeatedly disconnect a switched portion from an unswitched portion of said integrating capacitance during one phase to dump charge and connect said switched portion to said unswitched portion during an alternate phase to drain charge from said unswitched portion to increase the lossiness of said integrating capacitance and control a state variable of the integrator stage in the modulator.

* * * * *